United States Patent
Jang

[11] Patent Number: 6,096,649
[45] Date of Patent: Aug. 1, 2000

[54] TOP METAL AND PASSIVATION PROCEDURES FOR COPPER DAMASCENE STRUCTURES

[75] Inventor: Syun-Ming Jang, Hsin-Chu, Taiwan

[73] Assignee: Taiwan Semiconductor Manufacturing Company, Hsin-Chu, Taiwan

[21] Appl. No.: 09/425,312

[22] Filed: Oct. 25, 1999

[51] Int. Cl.$^7$ ..................................... H01L 21/44
[52] U.S. Cl. .................. 438/687; 438/622; 438/624; 438/625; 438/687; 438/688
[58] Field of Search .................... 438/687, 688, 438/622, 637, 638, 625, 624, 669, 672

[56] References Cited

U.S. PATENT DOCUMENTS

| | | | |
|---|---|---|---|
| 5,027,188 | 6/1991 | Owada et al. | 357/68 |
| 5,561,623 | 10/1996 | Ema | 365/51 |
| 5,563,445 | 10/1996 | Iijima et al. | 257/698 |
| 5,616,931 | 4/1997 | Nakamura et al. | 257/48 |
| 5,654,589 | 8/1997 | Huang et al. | 257/763 |
| 5,659,201 | 8/1997 | Wollesen | 257/758 |
| 5,659,202 | 8/1997 | Ashida | 257/758 |
| 5,663,599 | 9/1997 | Lur | 257/750 |
| 5,674,781 | 10/1997 | Huang et al. | 437/192 |
| 5,677,244 | 10/1997 | Venkatraman | 437/198 |
| 5,693,563 | 12/1997 | Teong | 437/190 |
| 5,693,568 | 12/1997 | Liu et al. | 437/195 |
| 5,702,982 | 12/1997 | Lee et al. | 437/195 |
| 5,705,849 | 1/1998 | Zheng et al. | 257/530 |
| 5,731,624 | 3/1998 | Motsiff et al. | 257/529 |
| 5,736,192 | 4/1998 | Okamoto | 427/99 |
| 5,785,236 | 7/1998 | Cheung et al. | 228/180.5 |
| 5,883,435 | 3/1999 | Geffken et al. | 257/758 |
| 5,900,668 | 5/1999 | Woollesen | 257/522 |
| 5,904,565 | 5/1999 | Nguyen et al. | 438/687 |
| 5,907,788 | 5/1999 | Kasai | 438/622 |
| 5,936,261 | 8/1999 | Ma et al. | 257/59 |
| 5,939,788 | 8/1999 | McTeer | 257/751 |
| 6,020,266 | 2/2000 | Hussein et al. | 438/694 |

*Primary Examiner*—John F. Niebling
*Assistant Examiner*—Lynne A. Gurley
*Attorney, Agent, or Firm*—George O. Saile; Stephen B. Ackerman

[57] ABSTRACT

A process sequence used to form a gold wire bond, to an extended aluminum based structure, which in turn overlays a copper damascene structure, has been developed. The process features the creation of an extended aluminum based structure, used to accept the gold wire bond, thus reducing the risk of increased interface resistance, sometimes encountered when gold wire is directly bonded to copper. The process also features the creation of dummy aluminum based structures, used to increase the roughens of the surface topography, allowing improved adhesion between an overlying molding substance, used for passivation purposes, and the underlying semiconductor chip, to be realized.

20 Claims, 7 Drawing Sheets

TOP METAL AND PASSIVATION PROCEDURES FOR COPPER DAMASCENE STRUCTURES

BACKGROUND OF THE INVENTION (1) Field of the Invention

The present invention relates to processes used to fabricate semiconductor devices, and more specifically to a process used to bond gold wires to an underlying copper interconnect structure.

(2) Description of Prior Art

The use of copper interconnect structures has allowed increased semiconductor device performance to be realized, as a result of the less resistant copper interconnects, when compared to aluminum based counterparts. In addition, the use of damascene processing, has allowed a reduction of the topography of advanced semiconductor devices, resulting from several metal, as well as passivation levels, to be realized. The chemical mechanical polishing procedure, used to remove unwanted regions of copper, from the top surface of a passivation layer, results in reduced topography in the form of a smooth top surface, comprised of a copper damascene structure, embedded in a damascene opening in an insulator layer. The smooth top surface however, can present difficulties, in the form of adhesion loss, when a protective molding substance, is applied on the smooth surface, after creating gold bonds to the copper damascene structure. The adhesion of the molding substance, to the underlying, smooth, top surface topography of the passivation layer, would be improved with a rougher underlying topography. In addition the success of gold bonding would be increased if the gold bonds were made on a material other than copper.

This invention will describe a process in which adhesion of a molding compound, applied to an underlying semiconductor chip, comprised with copper damascene structures, is improved via creation of non-smooth topography, resulting from aluminum structures, overlying, and extending upwards, from an underlying copper damascene structure. In addition this invention will also describe the fabrication of "dummy" aluminum structures, placed entirely on underlying passivating insulator layers, for the purpose of further increasing topography, and thus further improving the adhesion of the molding substance to the underlying semiconductor chip. Another objective of this invention is ease the bonding process, by bonding the gold wire, directly to the aluminum extension, which directly overlays the copper damascene structure, thus avoiding the more difficult bonding procedure of gold to copper. Prior art, such as Ijima et al, in U.S. Pat. No. 5,563,445, describe the use of "dummy bumps" to maintain specified distance between a semiconductor chip, and a circuit board, using materials, as well as a process sequence, different than the materials, and process sequence, used in the present invention.

SUMMARY OF THE INVENTION

It is an object of this invention to electrically connect a gold wire to underlying copper damascene structure, located on a semiconductor chip.

It is another object of this invention to bond a gold wire to an aluminum based structure, that directly overlays, and extends upward from, an underlying copper damascene structure.

It is still another object of this invention to create dummy aluminum based structure, entirely overlying an insulator layer, to provide additional topography that allows improved adhesion between an overlying molding substance, and the underlying semiconductor chip, to be realized.

In accordance with the present invention a method of electrically connecting a gold wire bond, to a copper damascene structure, located on a semiconductor chip, including a method of providing improved adhesion between a molding substance, and the underlying semiconductor chip, is described. A copper damascene structure is formed in a first insulator layer, using a chemical mechanical polishing procedure to remove copper from the top surface of the first insulator layer, resulting in a smooth top surface topography, comprised of the top surface of the copper damascene structure, and the top surface of the first insulator layer. An aluminum based layer, featuring a thin underlying barrier layer, and a thin overlying barrier layer, is deposited and patterned to create a first aluminum based structure, overlying the copper damascene structure, and to create a second aluminum based structure, on the top surface of the first insulator layer. A composite insulator layer, comprised of an underlying silicon oxide layer, and an overlying silicon nitride, are next deposited, followed by the creation of contact hole opening, in the composite insulator layer, exposing a region of the top surface of the first aluminum based structure. A gold wire is next bonded to the region of first aluminum based structure, exposed in the contact hole. A molding substance is then used to passivate the semiconductor chip, prior to packaging procedures, with improved adhesion of the molding substance to the semiconductor chip, realized as a result of the increased topography created by the dummy, or second aluminum based structures.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of electrically connecting a gold wire, to an underlying copper damascene structure, and the method of improving the adhesion between a protective molding compound, used prior to packaging procedures, and an underlying semiconductor chip, will now be described in detail. The subsequent process sequences will feature the formation of a gold wire bond, to a upper level metal structure, of a semiconductor chip, to electrically connect the semiconductor chip to an external package. This invention will show the creation of the upper level metal structure, the creation of the gold wire bond, and the molding substance used to passivate the semiconductor chip, during subsequent packaging procedures.

Figure 1:
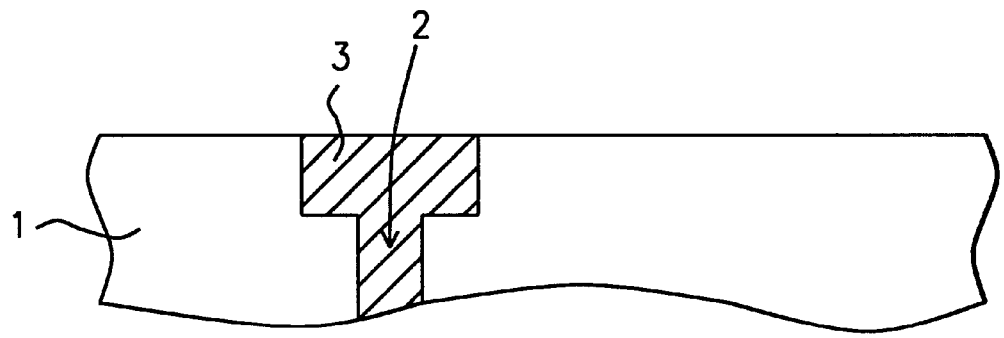
FIGS. 1–6, which schematically, in cross-sectional style, show the key stages of fabrication used to electrically connect a gold wire, to a underlying copper damascene structure, and used to improve the adhesion between a molding substance, to the underlying semiconductor chip.

FIG. 1, schematically shows a dual damascene opening 2, in a silicon oxide layer 1. The dual damascene opening is created via conventional photolithographic and anisotropic, reactive ion etching, (RIE), procedures. This invention illustrates a dual damascene opening, comprised a wide diameter, top opening, and a narrow diameter, lower opening. This is accomplished by initially forming the wide diameter opening, in silicon oxide layer 1, via use of a first photolithographic and a first RIE procedure, using $CHF_3$ as an etchant. After removal of the photoresist shape, used for definition of the wide diameter opening, via plasma oxygen ashing and careful wet cleans, a second photolithographic and a second RIE procedure, again using $CHF_3$ as an etchant, are employed to create the lower, narrow diameter opening, of dual damascene opening 2. Dual damascene opening 2, exposes an underlying region of conductive material, such as an underlying metal interconnect structure. (This is not shown in the drawings). Although a dual damascene opening is used in the description of this invention, a single shaped opening can also be employed.

A copper layer 3, is next deposited, completely filling dual damascene opening 2. A barrier layer of tantalum nitride, not shown in the drawings, is first deposited, prior to copper deposition, via plasma vapor deposition, (PVD), at a thickness between about 150 to 250 Angstroms. This thin barrier layer, used as an underlying material, coats the surfaces of dual damascene opening 2, prior to copper deposition. The deposition of copper layer 3, initiates with the PVD of a copper seed layer, at a thickness between about 750 to 1250 Angstroms, at a temperature between about 150 to 250° C., followed by an electroplated copper process, performed at room temperature, resulting in an additional copper formation of about 1 to 1.5 um. A chemical mechanical polishing procedure is next used to remove unwanted regions of copper from the top surface of silicon oxide layer 1, creating copper damascene structure 3, in dual damascene opening 2, shown schematically in FIG. 1. If desired, the unwanted regions of copper can be removed from the top surface of silicon oxide layer 2, via a selective RIE procedure, using $Cl_2$ as an etchant.

The resulting structure, comprised of a top surface of the upper level interconnect structure, copper damascene structure 3, is not conducive to a subsequent gold wire bonding procedure. Difficulties in bonding gold wire to copper, can result in resistive interfaces between these materials. Therefore an aluminum based structure, is placed, overlaying copper damascene structure 3, allowing a subsequent gold wire bond to be made to the aluminum based structure, without the resistive interface resulting from gold—copper interfaces. The aluminum based structure, is therefore used as an intermediate structure between the gold wire and the copper damascene structure. In addition the smooth top surface topography presented by silicon oxide layer 1, and copper damascene structure 3, present difficulties in adhesion between a molding substance, used for packaging purposes, applied after the gold bonding procedure, and the underlying, smooth top surface topography. Therefore dummy aluminum based structures are placed on the top surface of silicon oxide layer 1, creating the topography needed for adhesion of the molding substance, to the underlying semiconductor chip. These fabrication procedures are now described using FIGS. 2–6.

Figure 2:
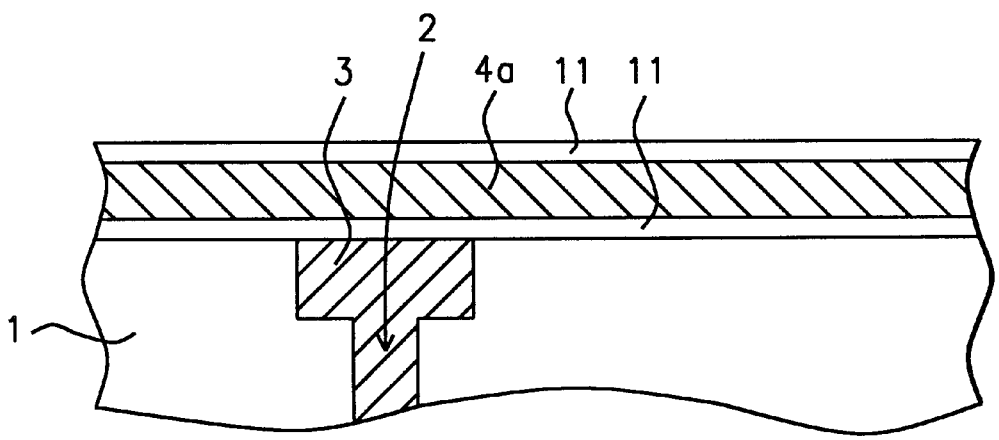
Figure 3:
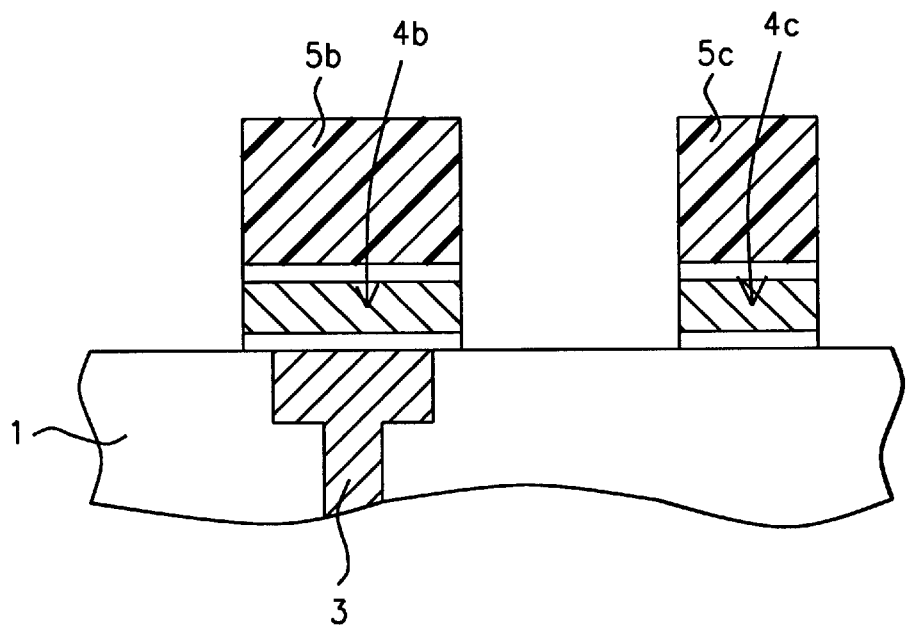

An aluminum based layer 4a, containing between about 0.5 to 1.5 weight percent copper, is deposited via R.F. sputtering, to a thickness between about 1.0 to 1.5 um. Thin barrier layers 11, are deposited, via R.F. sputtering procedures, to a thickness between about 200 to 300 Angstroms, for a titanium nitride layer overlying aluminum based layer 4a, and to a thickness between about 150 to 250 Angstroms for a composite titanium/titanium nitride layer, underling aluminum based layer 4. This is schematically shown in FIG. 2. Conventional photolithographic procedures, using photoresist shapes 5b, and 5c, as etch masks, and using anisotropic RIE procedures, with $Cl_2$ as an etchant, are employed to create aluminum based structure 4b, directly overlying copper damascene structure 3, and used to create dummy, aluminum based structure 4c, directly overlying silicon oxide layer 1. This is schematically shown in FIG. 3. Removal of photoresist shapes 5b, and 5c, is accomplished using plasma oxygen ashing and careful wet cleans.

Figure 4:
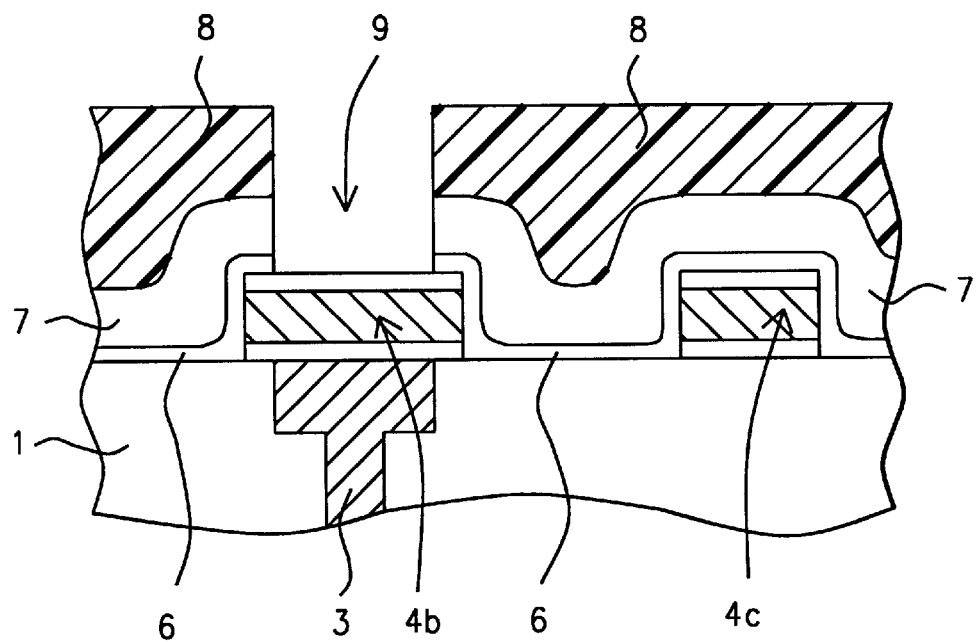
Figure 5:
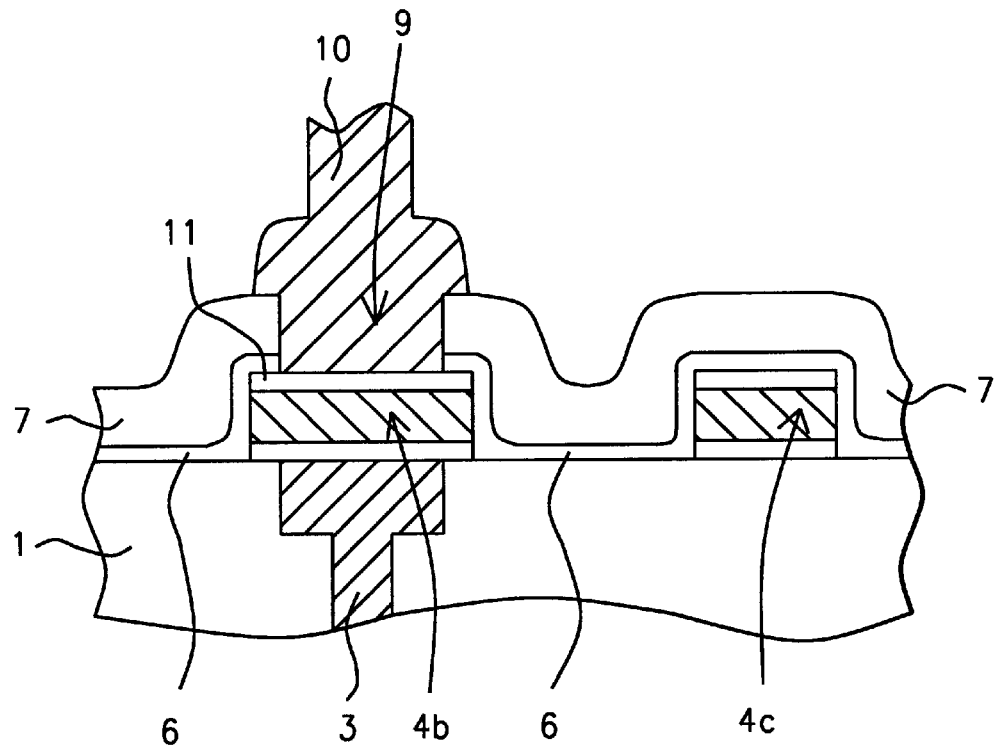

A thin silicon oxide layer 6, is next deposited via plasma enhanced chemical vapor deposition, (PECVD), procedures, to a thickness between about 1000 to 3000 Angstroms, followed by the deposition of silicon nitride layer 7, again via PECVD procedures, at a thickness between about 7000 to 10000 Angstroms. Photoresist shape 8, and an anisotropic RIE procedure, using $CF_4/CHF_3/Ar$ as an etchant, are used to create opening 9, in silicon nitride layer 7, and in thin silicon oxide layer 6, exposing a region of the top surface of aluminum based structure 4b. This is schematically shown in FIG. 4.

After removal of photoresist shape 8, via plasma oxygen ashing and careful wet cleans, gold wire 10, is bonded to the region of aluminum based structure 4b, overlaid with barrier layer 11, exposed in opening 9. This is shown schematically in FIG. 5. The ability to gold bond to aluminum based structure 4b, results in less interface resistance than counterpart bonds, in which gold was directly bonded to copper. The electrical connection between elements of the semiconductor chip, and the external package, is satisfied via the gold bond to the aluminum based structure, which in turn communicates with the underlying copper damascene structure.

Figure 6:
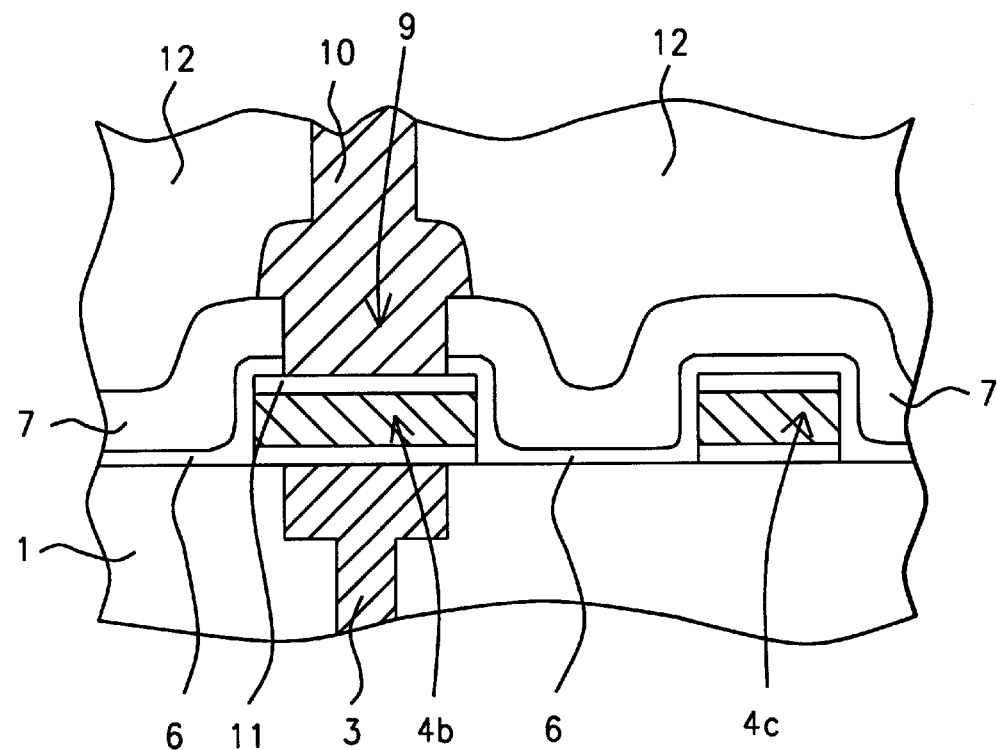

Finally a molding substance 12, is applied, and used to protect the semiconductor chip during dicing, and packaging procedures. The use of dummy aluminum based structure 4c, (or dummy aluminum based structures, since more than just one dummy structure can be formed if desired), increases the roughness of the top surface topography of the underlying features, allowing improved adhesion of molding substance 12, to underlying features of the semiconductor substrate, to result, when compared to counterparts fabricated with smoother topographies. This is schematically shown in FIG. 6.

Figure 7:
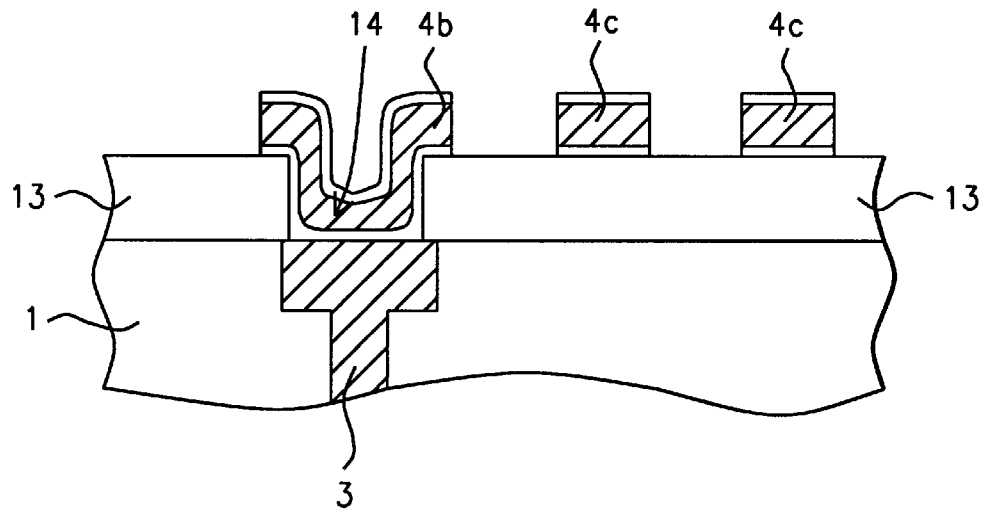
FIGS. 7–8, which schematically in cross-sectional style, show the key stages, of a second iteration used for the process of electrically connecting a gold wire, to an underlying copper damascene structure, featuring the use of a thick insulator layer, needed to enhance the top surface topography of a semiconductor chip, prior to the application of a molding compound.
Figure 8:
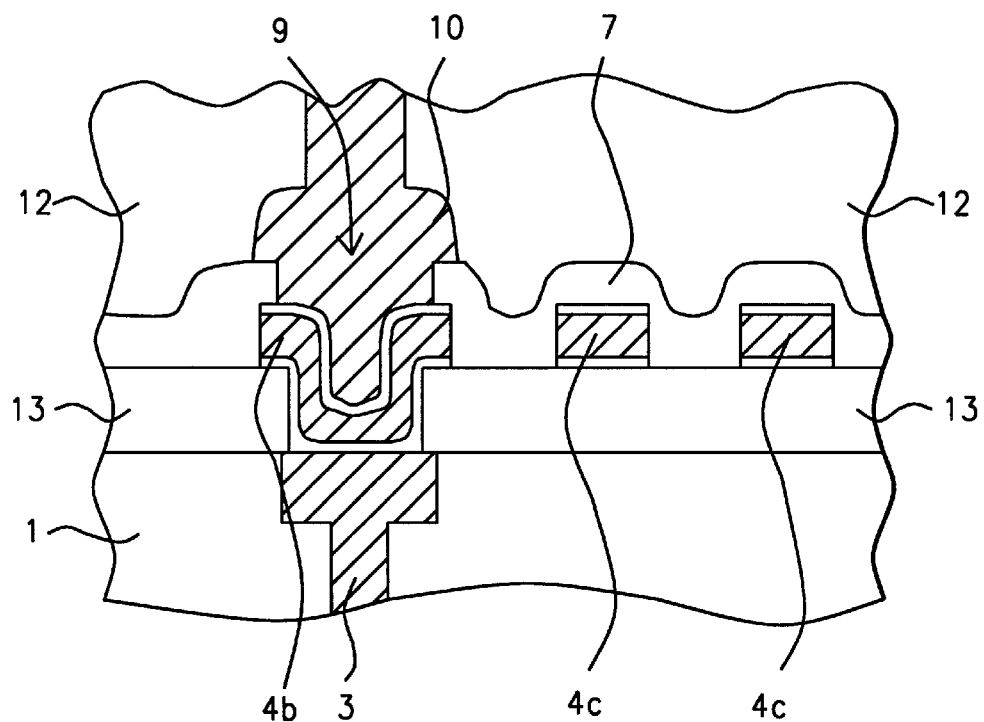

Additional top surface topography, used for optimum adhesion of the molding compound to the underlying semiconductor, can be achieved via a process sequence schematically shown in FIGS. 7–8. After formation of copper damascene structure 3, a thick insulator layer 13, comprised of silicon oxide, or comprised of a composite insulator layer, such as silicon nitride/silicon oxide, is deposited via plasma enhanced chemical vapor deposition, (PECVD), procedures, at a thickness between about 1.0 to 2.0 um. Conventional photolithographic and RIE procedures, are used to create opening 14, in insulator 13, exposing a portion of the top surface of copper damascene structure 3. Aluminum based structures 4b, and 4c, are next formed, using the identical materials and conditions previously used, and shown in FIGS. 2–3, however supplying additional topography as a result of opening 14, in thick insulator layer 13. This is schematically shown in FIG. 7. The gold bonding procedure, and the application of molding compound 12, schematically shown in FIG. 8, is again identical to those procedures previously shown and described in FIGS. 4–6.

Figure 9:
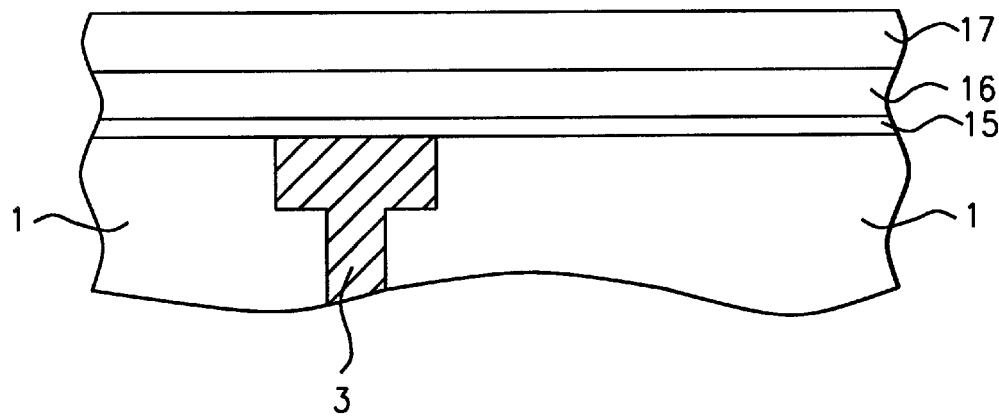
FIGS. 9–14, which schematically, in cross-sectional style, show key stages of fabrication for a third iteration of this invention, featuring the creation of dummy insulator patterns, on an underlying composite insulator layer, again used to enhance the top surface topography of a semiconductor chip, prior to the application of a molding compound.

Another iteration of this invention, allowing additional top surface topography to be created for subsequent improved adhesion of an overlying molding compound, to an underlying semiconductor, is next described and schematically shown in FIGS. 9–14. After formation of copper damascene structure 3, in insulator layer 1, a series of insulator layers are deposited, comprised of: silicon nitride layer 15, obtained via plasma enhanced chemical vapor deposition, (PECVD), procedures, at a thickness between about 300 to 600 Angstroms; silicon oxide layer 16, obtained via PECVD procedures, at a thickness between about 2000 to 4000 Angstroms; and silicon nitride layer 17, obtained via PECVD procedures, at a thickness between about 5000 to 7000 Angstroms. This is schematically shown in FIG. 9.

Figure 10:
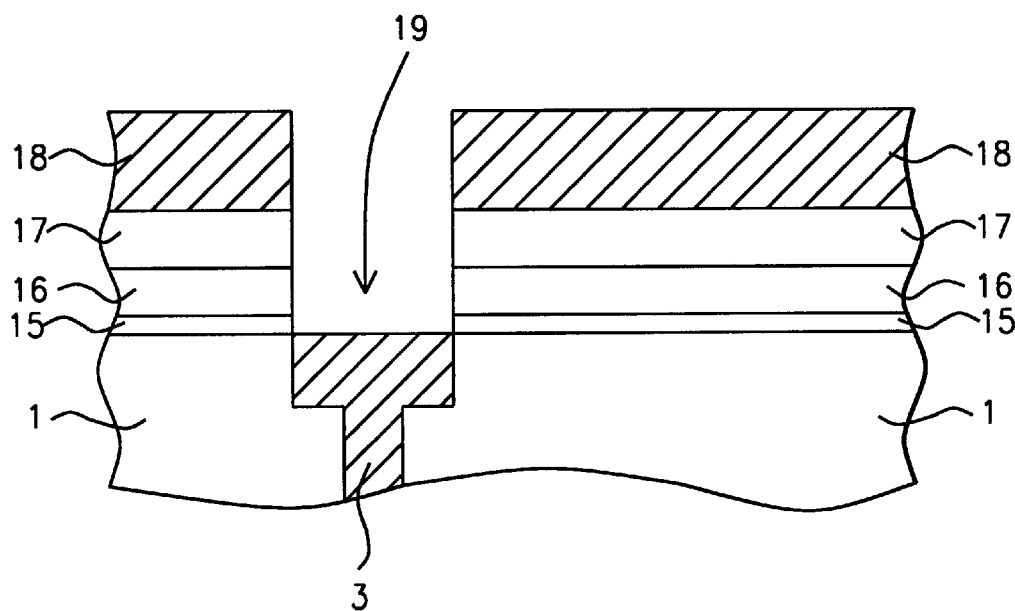
Figure 11:
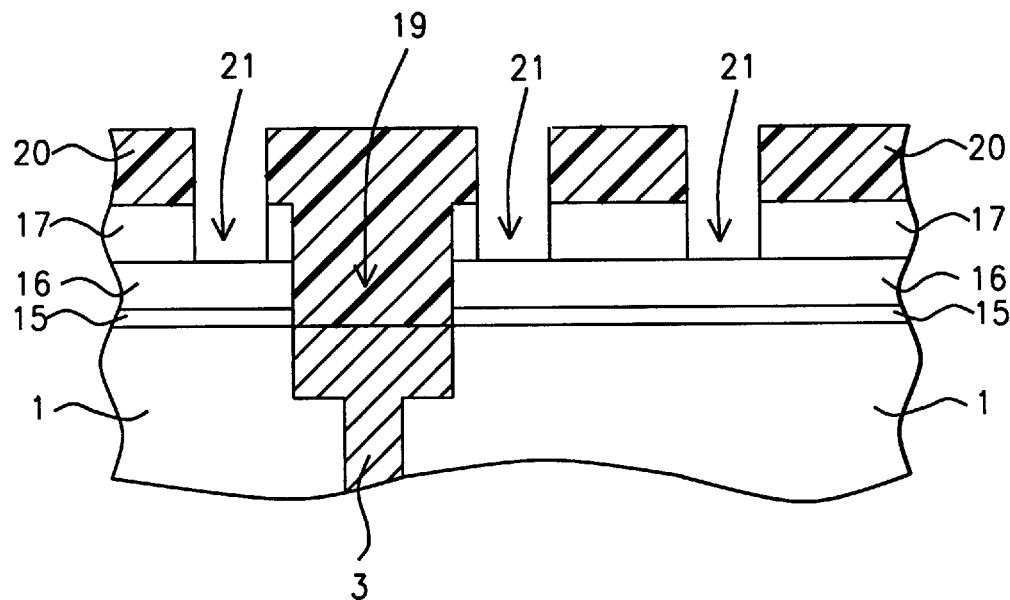
Figure 12:
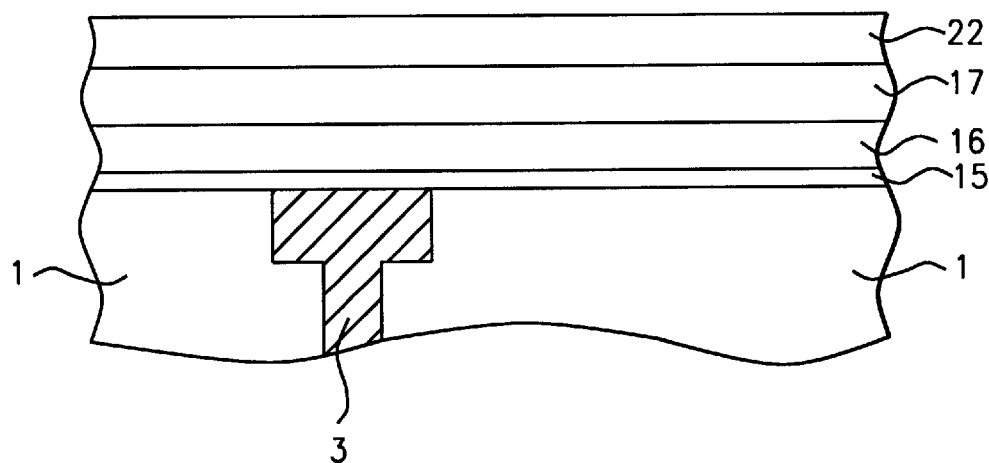

Photoresist shape 18, is then used as an etch mask to allow an anisotropic RIE procedure to create opening 19, in the series of insulator layers, exposing a portion of the top surface of copper damascene structure 3. This is schematically shown in FIG. 10. After removal of photoresist shape 18, via plasma oxygen ashing and careful wet cleans, photoresist shape 20, is formed, and used as a mask to allow an anisotropic RIE procedure to remove exposed regions of silicon nitride layer 17. This is shown schematically, as openings 21, in FIG. 11. The removal of exposed regions of silicon nitride layer 17, results in non-etched silicon nitride islands, overlying silicon oxide layer 16, and presenting additional surface topography which in turn will allow enhanced adhesion of a subsequent molding compound, to the underlying topography, to be realized.

Figure 13:
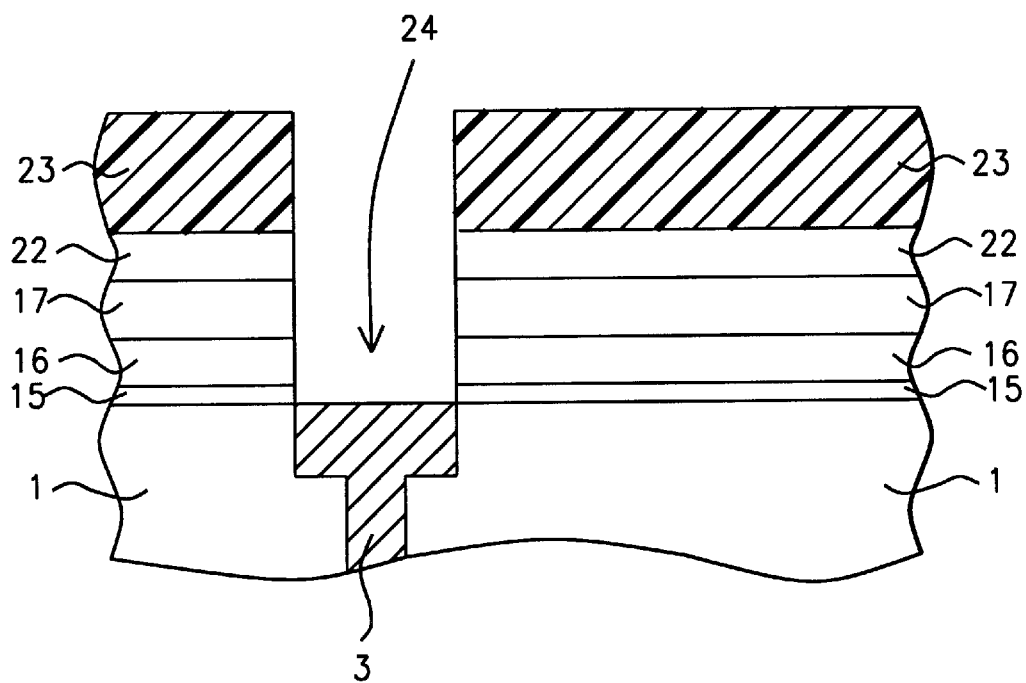
Figure 14:
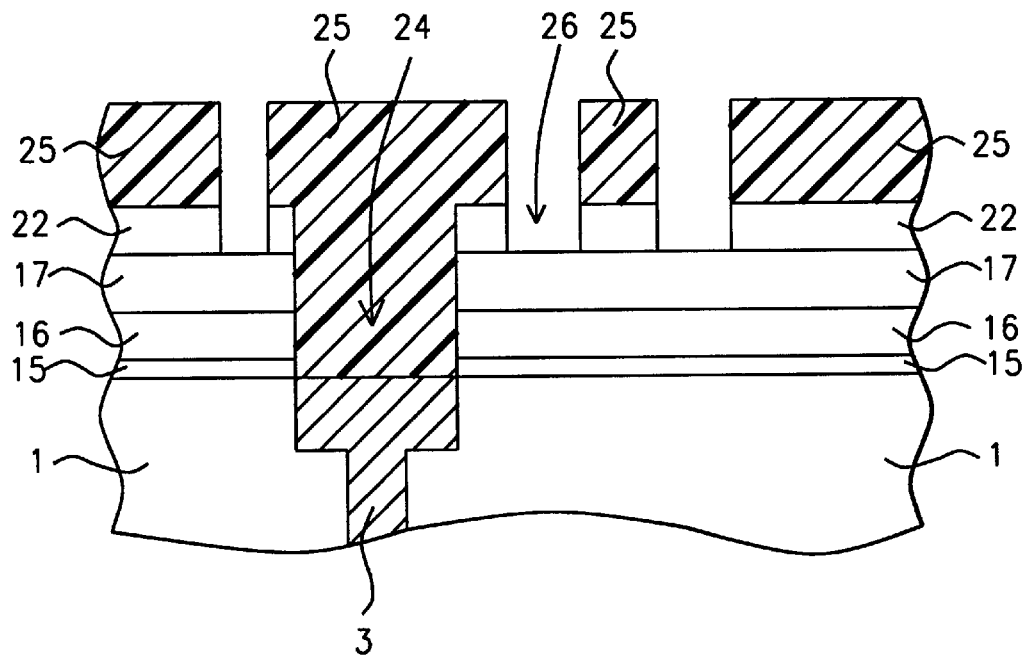

To further increase surface topography an additional insulator layer 22, comprised of silicon oxide, obtained via PECVD procedures, at a thickness between about 3000 to 5000 Angstroms, is deposited on underlying silicon nitride layer 17. This is shown schematically in FIG. 12. Photoresist shape 23, shown schematically in FIG. 13, is then used as an etch mask to expose in opening 24, a portion of the top surface of copper damascene structure, followed by the formation of photoresist shape 25, used as an etch mask to remove exposed portions of silicon oxide layer 22, creating openings 26. This is schematically shown in FIG. 14. The creation of openings 26, and the remaining silicon oxide islands, again result in an increase in the severity of the surface topography, allowing improved adhesion of the molding compound to the underlying surface, to be realized.

While this invention has been particularly shown and described with reference to, the preferred embodiments thereof, it will be understood by those skilled in the art that various changes in form and detail may be made without departing from the spirit and scope of this invention.

What is claimed is:

1. A method of forming a wire bond to an underlying metal structure, on a semiconductor substrate, comprising the steps of:

forming a damascene metal structure, in a first insulator layer, on a semiconductor substrate, resulting in a smooth, top surface topography, comprised of the top surface of said damascene metal structure, and the top surface of said first insulator layer;

forming a first aluminum based structure, overlying said damascene metal structure, and forming a second aluminum based structure, overlying the top surface of a portion of said first insulator layer, increasing the roughness of said top surface topography;

depositing a composite insulator layer;

forming an opening in said composite insulator layer, exposing a portion of the top surface of said first aluminum based structure;

forming a wire bond to a region of said first aluminum based structure, exposed in said opening, in said composite insulator layer; and applying a molding substance, surrounding said wire bond, overlying said first aluminum based structure, and said second aluminum based structure, and completely filling space between said first and second aluminum based structures.

2. The method of claim 1, wherein said first insulator layer is a silicon oxide layer.

3. The method of claim 1, wherein said damascene metal structure, is formed in a dual damascene opening, created in said first insulator layer, with said dual damascene opening comprised with a wide diameter, top opening, and with a narrower diameter, lower opening.

4. The method of claim 1, wherein said damascene metal structure, is a copper structure, formed from deposition of: an underlying tantalum nitride barrier layer, via plasma vapor deposition, (PVD), at a thickness between about 150 to 250 Angstroms; a copper seed layer, obtained via PVD procedures, at a thickness between about 750 to 1250 Angstroms; and a copper layer, obtained via electroplating procedures, at a thickness between about 1.0 to 1.5 um; than defined via a chemical mechanical polishing procedure, removing unwanted regions of the tantalum nitride, and copper layers, from the top surface of said first insulator layer.

5. The method of claim 1, wherein said first aluminum based structure, and said second aluminum based structure, are formed from an aluminum based layer, obtained via R.F. sputtering, at a thickness between about 1.0 to 1.5 um, containing between about 0.5 to 1.5 weight percent copper, with the aluminum based structures comprised with an overlying layer of titanium nitride, obtained via R.F. sputtering, at a thickness between about 200 to 300 Angstroms, and comprised with an underlying composite layer of titanium/titanium nitride, obtained via R.F. sputtering, at a thickness between about 150 to 250 Angstroms.

6. The method of claim 1, wherein said first aluminum based structure, and said second aluminum based structure, are formed via an anisotropic RIE procedure, applied to said aluminum based layer, and to the overlying and underlying titanium nitride layers, using $Cl_2$ as an etchant.

7. The method of claim 1, wherein said composite insulator layer is comprised of an underlying silicon oxide layer, obtained via PECVD procedures, at a thickness between about 1000 to 3000 Angstroms, and an overlying silicon nitride layer, obtained via PECVD procedures, at a thickness between about 7000 to 10000 Angstroms.

8. The method of claim 1, wherein said opening, in said composite insulator layer, is created via an anisotropic RIE procedure, using $CF_4/CHF_3/Ar$ as an etchant.

9. The method of claim 1, wherein said wire bond, created to said first aluminum based structure, is a gold wire bond.

10. A method of obtaining an electrical connection to a copper damascene structure, via a gold wire bond, formed on an aluminum based structure, which in turn is located overlying said copper damascene structure, comprising the steps of:

forming said copper damascene structure, in a first silicon oxide layer, resulting in a smooth top surface topography, comprised of the top surface of said copper damascene structure, and the top surface of said first silicon oxide layer;

depositing an underlying titanium nitride layer, an aluminum—copper layer, and an overlying titanium nitride layer;

patterning of said overlying titanium nitride layer, of said aluminum—copper layer, and of said underlying titanium nitride layer, to create an extended aluminum based structure, overlying said copper damascene structure, and to create a dummy aluminum based structure, located on the top surface of said first insulator layer, and resulting in an increase in roughness for said top surface topography;

depositing a second silicon oxide layer;

depositing a silicon nitride layer;

forming an opening in said silicon nitride layer, and in said second silicon oxide layer, exposing a portion of the top surface of said extended aluminum based structure;

forming said gold wire bond to the region of said extended aluminum based structure, exposed in said opening, in said silicon nitride layer, and in said second silicon oxide layer; and applying a molding substance, surrounding said gold wire bond, covering said extended aluminum based structure, and said dummy aluminum based structure, and filling spaces between said extended and dummy aluminum based structures.

11. The method of claim 10, wherein said copper damascene structure, is comprised of copper, obtained via a: deposition of a tantalum nitride, barrier layer, via PVD procedures, at a thickness between about 150 to 250 Angstroms; a deposition of a copper seed layer, via PVD procedures, at a thickness between about 750 to 1250 Angstroms; and a deposition of a copper layer, via electroplating procedures, at a thickness between about 1.0 to 1.5 um.

12. The method of claim 10, wherein said copper damascene structure is formed via a chemical mechanical polishing procedure, applied to a copper layer.

13. The method of claim 10, wherein said aluminum—copper layer, is obtained via R.F. sputtering, at a thickness between about 1.0 to 1.5 um, containing between about 0.5 to 1.5 weight percent copper.

14. The method of claim 10, wherein said underlying titanium nitride layer, and said overlying titanium nitride layer, are obtained via R.F. sputtering, at a thickness between about 200 to 300 Angstroms.

15. The method of claim 10, wherein said extended aluminum based structure, and said dummy aluminum based structure, are formed via an anisotropic RIE procedure, applied to said overlying titanium nitride layer, to said aluminum—copper layer, and to said underlying titanium nitride layer, using $Cl_2$ as an etchant.

16. The method of claim 10, wherein said second silicon oxide layer is obtained via PECVD procedures, at a thickness between about 1000 to 3000 Angstroms.

17. The method of claim 10, wherein said silicon nitride layer is obtained via PECVD procedures, at a thickness between about 7000 to 10000 Angstroms.

18. The method of claim 10, wherein said opening is formed in said silicon nitride layer, and in said silicon oxide layer, via an anisotropic RIE procedure, using $CF_4/CHF_3/Ar$ as an etchant.

19. A method of forming a gold wire bond to an underlying metal structure, on a semiconductor substrate, comprising the steps of:

forming a copper damascene structure in a first insulator layer;

depositing a second insulator layer, between about 1.0 to 2.0 um, in thickness;

forming an opening in said second insulator layer, exposing a portion of the top surface of said copper damascene structure;

forming a first aluminum based structure, with a first portion of said first aluminum based structure, overlying and contacting said copper damascene structure, exposed in said opening, in said second insulator layer, and with a second portion of said first aluminum based structure, overlying a portion of the top surface of said second insulator layer;

forming additional aluminum based structures, completely located on the top surface of said second insulator layer;

depositing a composite insulator layer;

forming an opening in said composite insulator layer, exposing a portion of the top surface of said first aluminum based structure;

forming a gold wire bond to a region of said first aluminum based structure, exposed in the opening in said composite insulator layer; and applying a molding substance, surrounding said gold wire bond.

20. A method of increasing surface topography of an insulator layer, to improve the adhesion of an overlying molding compound, to underlying, said insulator layer, featuring the increased surface topography, comprising the step of:

providing a copper damascene structure, in an insulator layer;

depositing a first silicon nitride layer;

depositing a silicon oxide layer;

depositing a second silicon nitride layer;

forming an opening in said second silicon nitride layer, in said silicon oxide layer, and in said first silicon nitride layer, exposing a portion of the top surface of said copper damascene structure; and patterning said second silicon nitride layer to increase the surface topography of said second silicon nitride layer.

* * * * *